(12) United States Patent  
Swenson

(10) Patent No.: US 7,566,888 B2
(45) Date of Patent: Jul. 28, 2009

(54) METHOD AND SYSTEM FOR TREATING AN INTERIOR SURFACE OF A WORKPIECE USING A CHARGED PARTICLE BEAM

(75) Inventor: David Richard Swenson, Georgetown, MA (US)

(73) Assignee: TEL Epion Inc., Billerica, MA (US)

( * ) Notice: Subject to any disclaimer, the term of this patent is extended or adjusted under 35 U.S.C. 154(b) by 303 days.

(21) Appl. No.: 11/752,774

(22) Filed: May 23, 2007

(65) Prior Publication Data

US 2008/0290298 A1 Nov. 27, 2008

(51) Int. Cl.
*A61N 5/00* (2006.01)
*G21G 5/00* (2006.01)

(52) U.S. Cl. .............................. 250/492.3; 250/492.23; 250/492.1; 250/492.2; 250/396 R; 250/396 ML; 250/397; 250/305; 250/307; 250/310; 250/311; 250/287; 250/257; 250/282; 850/9; 850/10; 427/450; 427/523; 204/192.1

(58) Field of Classification Search .............. 250/492.3, 250/492.23, 492.1, 492.2, 396 R, 396 ML, 250/397, 305, 307, 310, 311, 287, 257, 282; 850/9, 10; 427/450, 523; 204/192.1
See application file for complete search history.

(56) References Cited

U.S. PATENT DOCUMENTS

| | | | |
|---|---|---|---|
| 6,486,478 B1 | 11/2002 | Libby et al. | |
| 6,537,606 B2 | 3/2003 | Allen et al. | |
| 6,635,883 B2 | 10/2003 | Torti et al. | |
| 6,646,277 B2 | 11/2003 | Mack et al. | |
| 6,737,643 B2 | 5/2004 | Torti et al. | |
| 6,770,874 B2 * | 8/2004 | Dykstra | 250/287 |
| 6,831,272 B2 * | 12/2004 | Mack et al. | 250/287 |
| 7,060,988 B2 | 6/2006 | Mack et al. | |
| 7,067,828 B2 * | 6/2006 | Swenson | 250/492.21 |
| 7,115,511 B2 | 10/2006 | Hautala | |
| 7,173,252 B2 | 2/2007 | Mack | |
| 2005/0181621 A1 | 8/2005 | Borland et al. | |
| 2005/0202657 A1 | 9/2005 | Borland et al. | |

FOREIGN PATENT DOCUMENTS

WO 2004053945 A2 6/2004

OTHER PUBLICATIONS

Insepov et al., Computer Simulation of Surface Modification With Ion Beams, Physica C 441, 2006, pp. 114-117.
Swenson et al., "Study of Gas Cluster Ion Beam Surface Treatments for Mitigating RF Breakdown", Physica C 441, 2006, pp. 75-78.

(Continued)

*Primary Examiner*—David A Vanore
*Assistant Examiner*—Meenakshi S Sahu
(74) *Attorney, Agent, or Firm*—Wood, Herron & Evans, LLP

(57) ABSTRACT

A method and system of treating an interior surface on an internal cavity of a workpiece using a charged particle beam. A beam deflector surface of a beam deflector is placed within the internal cavity of the workpiece and is used to redirect the charged particle beam toward the interior surface to treat the interior surface.

23 Claims, 5 Drawing Sheets

OTHER PUBLICATIONS

Insepov et al., "Computer Simulation of Surface Modification With Ion Beams", Nuclear Instruments and Methods in Physics Research B, 2005 (5 pages).

Swenson et al., "Smoothing RF Cavities With Gas Cluster Ions to Mitigate High Voltage Breakdown", Nuclear Instruments and Methods in Physics Research B 241, 2005, pp. 641-644.

Swenson, D.R., "Measurement of Averages of Charge, Energy and Mass of Large, Multiply Charged Cluster Ions Colliding with Atoms" Nucl. Instr. and Meth. in Phys. Res. B (2004), 7 pages.

* cited by examiner

METHOD AND SYSTEM FOR TREATING AN INTERIOR SURFACE OF A WORKPIECE USING A CHARGED PARTICLE BEAM

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. DE-FG02-04ER83944 awarded by the U.S. Department of Energy.

BACKGROUND OF THE INVENTION

1. Field of Invention

The present invention relates to a method and system for treating a workpiece using a charged particle beam, and more particularly to a method and system of using a charged particle beam to treat an interior surface of a workpiece.

2. Description of Related Art

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the workpiece. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing. Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases. Several emerging applications for GCIB processing of workpieces on an industrial scale are in the semiconductor field. Although GCIB processing of a workpiece is performed using a wide variety of gas-cluster source gases, many of which are inert gases, many semiconductor processing applications use reactive source gases, sometimes in combination or mixture with inert or noble gases, to form the GCIB. Conventional GCIB processing techniques suffer from a general inability to process all surfaces on workpieces having a complex topology. For example, certain types of workpieces include internal cavities bounded by interior surfaces. These interior surfaces are difficult to treat using conventional GCIB processing techniques because of difficulties represented in presenting these interior surfaces to the GCIB for impingement by the ionized clusters. Certain workpiece topologies may render it impossible to expose the interior surfaces to the GCIB using conventional GCIB processing techniques.

SUMMARY OF THE INVENTION

Embodiments of the present invention relates to a method and system for treating a workpiece using a charged particle beam. Furthermore, the method and system provide for using a gas cluster ion beam (GCIB) to treat an interior surface of a workpiece.

According to one embodiment, a method of treating an interior surface on an internal cavity of a workpiece using a gas cluster ion beam (GCIB) is described. The method comprises positioning the workpiece in a GCIB processing system and positioning a beam deflector within the internal cavity of the workpiece. Thereafter, the workpiece is exposed to a GCIB formed in the GCIB processing system, and the GCIB is re-directed by the beam deflector to the interior surface of the internal cavity of the workpiece to treat the interior surface.

According to another embodiment, a processing system is configured to treat a workpiece having an internal cavity with an interior surface. The processing system may comprise a charged particle beam source disposed in a vacuum vessel and a beam deflector disposed in the vacuum vessel. The charged particle beam source is configured to produce a charged particle beam. The processing system may further comprise a workpiece holder configured to support the workpiece inside the vacuum vessel for treatment by the charged particle beam. A positioning system is mechanically coupled with the beam deflector. The positioning system is configured to position a beam deflector surface of the beam deflector inside the internal cavity of the workpiece. The positioning system is also configured to move the beam deflector relative to the internal cavity of the workpiece so that the beam deflector surface intercepts and re-directs the charged particle beam toward the interior surface.

According to yet another embodiment, a beam deflector is provided for use in a gas cluster ion beam (GCIB) processing system to treat a workpiece having an internal cavity with an interior surface. The beam deflector may include an arm member and a positioning system mechanically coupled with the arm member. The positioning system is configured to position the arm member such that a beam deflector surface of the arm member is inside the internal cavity of the workpiece. The positioning system is configured to move the arm member relative to the internal cavity of the workpiece so that the beam deflector surface intercepts and re-directs the GCIB toward the interior surface.

DETAILED DESCRIPTION OF SEVERAL EMBODIMENTS

Figure 1:
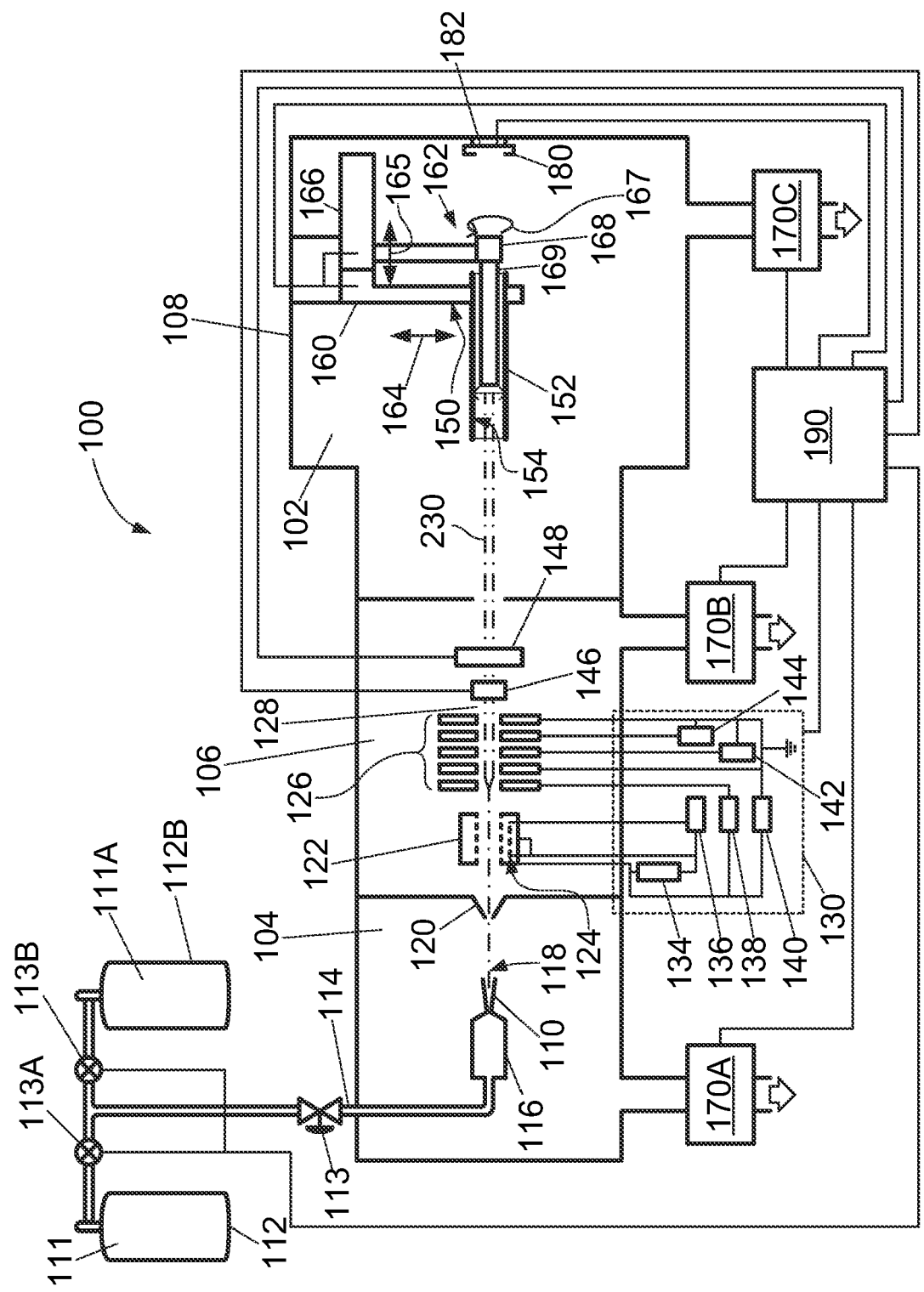
FIG. 1 is a diagrammatic view of a GCIB processing system including an embodiment of a beam deflector.

A method and system for treating a workpiece using a charged particle beam, such as a gas cluster ion beam (GCIB), is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

There is a general need for treating various surfaces on a workpiece and, in particular, there is a general need for treating complex surfaces on a workpiece using a charged particle beam, such as a GCIB. Such complex surfaces on a workpiece can include an interior surface on an internal cavity of the workpiece, wherein accessibility to the interior surface or surfaces by the GCIB is limited. For example, the workpiece may include a tubular workpiece, such as a waveguide member for electromagnetic (EM) wave propagation or an accelerator member for a linear accelerator. Moreover, these workpieces may comprise complex topographies for their interior surfaces, i.e., high degrees of curvature. Although the embodiments to follow describe the use of a GCIB to treat the surfaces of a workpiece, other charged particle beams are contemplated including, for example, an ion beam or an electron beam.

According to one embodiment, a method and system of treating an interior surface on an internal cavity of a workpiece using a gas cluster ion beam (GCIB) is described. The method and system comprise positioning the workpiece in a GCIB processing system and positioning a beam deflector within the internal cavity of the workpiece. Thereafter, the workpiece is exposed to a GCIB formed in the GCIB processing system, and the GCIB is re-directed by the beam deflector to the interior surface on the internal cavity of the workpiece to treat the interior surface. The treatment of the interior surface or interior surfaces may include sputtering the surface, etching the surface, depositing material on the surface, smoothing the surface, hardening the surface, chemically treating the surface, or physically treating the surface, or any combination of two or more thereof. For example, the GCIB may be utilized to smooth sub-micron-scale roughness and remove particulate contamination that can cause emission and breakdown of high-voltage electrodes and that are limitations in the development of high gradient EM wave technology.

By adjusting the orientation of the beam deflector relative to the workpiece, and optionally, the workpiece and/or beam deflector relative to the GCIB, the interior surface or surfaces of the workpiece can be treated by the GCIB. One or more properties of the GCIB, including the beam composition, beam dose, beam intensity, etc., can be adjusted or controlled or both in order to facilitate treatment of the interior surface or surfaces of the workpiece.

With reference to FIG. 1 and in accordance with an embodiment, a representative GCIB processing system 100 includes a vacuum vessel 102, workpiece holder 150, upon which a workpiece 152 to be processed is affixed, and vacuum pumping systems 170A, 170B, and 170C. GCIB processing system 100 is configured to produce a GCIB to treat workpiece 152. The vacuum vessel 102 comprises three communicating chambers, namely, a source chamber 104, an ionization/acceleration chamber 106, and a processing chamber 108 to define a reduced-pressure enclosure. Gas clusters can be formed as a gas jet 118 in the source chamber 104. A gas cluster ion beam (GCIB) 128 is formed in the ionization/acceleration chamber 106 wherein gas clusters from the gas jet 118 admitted from the source chamber 104 are ionized and accelerated. The GCIB 128 is subsequently filtered in the ionization/acceleration chamber 106 to generate a filtered GCIB 230 that is communicated from the ionization/acceleration chamber 106 to the processing chamber 108. The filtered GCIB 230 is utilized to treat the workpiece 152 in the processing chamber 108.

The chambers 102, 104, 106 are evacuated to suitable operating pressures by vacuum pumping systems 170A, 170B, and 170C, respectively. Vacuum pumping systems 170A, 170B, and 170C can include turbo-molecular vacuum pumps (TMP) capable of pumping speeds up to about 5000 liters per second (or greater) and a gate valve for throttling the chamber pressure. In conventional vacuum processing devices, a TMP with a pumping speed of about 1000 liters per second to 3000 liters per second can be employed. TMPs are useful for low pressure processing, typically less than about 50 mTorr. Furthermore, a pressuring-measuring device for monitoring chamber pressure (not shown) can be coupled to the vacuum vessel 102 or to any of the individual vacuum chambers 104, 106, 108. The pressure-measuring device can be, for example, a capacitance manometer or an ionization gauge.

A first gas composition 111, which is stored in a first gas source 112, is admitted under pressure through a first gas control valve 113A to a gas metering valve or valves 113.

Additionally, an optional second gas composition 111A, which is stored in a second gas source 112B, is admitted under pressure through a second gas control valve 113B to the downstream gas metering valve or valves 113. According to one example, the first gas composition 111 can include a condensable inert gas. For example, the inert gas can include a noble gas, i.e., He, Ne, Ar, Kr, Xe, or Rn. Additionally, according to another example, the second gas composition can comprise a film forming gas composition, an etching gas composition, a cleaning gas composition, a smoothing gas composition, etc. Furthermore, the first gas source 111 and the second gas source 112B may be utilized either alone or in combination with one another to produce ionized clusters comprising helium, neon, argon, krypton, xenon, nitrogen, oxygen, hydrogen, methane, nitrogen trifluoride, carbon dioxide, sulfur hexafluoride, nitric oxide, or nitrous oxide, or any combination of two or more thereof. Alternatively, the first gas composition 111 and the second gas composition 111A may be pre-mixed or pre-diluted or both, and may be delivered from a single gas source.

The high pressure, condensable gas comprising the first gas composition 111, the second gas composition 111A, or both, is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas jet 118 emanates from nozzle 110.

The inherent cooling of the jet as static enthalpy is exchanged for kinetic energy, which results from the expansion in the jet, causes a portion of the gas jet 118 to condense and form clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas jet 118, that may have not condensed into a cluster, from the gas molecules in the core of the gas jet, that may have formed clusters. Among other reasons, this selection of a portion of gas jet 118 can lead to a reduction in the pressure in the downstream regions where higher pressures may be detrimental (e.g., ionizer 122, suppressor electrode, and processing chamber 108). Furthermore, gas skimmer 120 defines an initial dimension for the gas cluster beam entering the acceleration/ionization chamber 106.

After the gas jet 118 has been formed in the source chamber 104, the constituent gas clusters in gas jet 118 are ionized by an ionizer 122 to form GCIB 128. The ionizer 122 may include an electron impact ionizer that produces electrons from one or more filaments 124, which are accelerated and directed to collide with the gas clusters in the gas jet 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

Beam electronics 130 are utilized to ionize, extract, accelerate, and focus the GCIB 128. The beam electronics 130 includes a set of suitably biased high voltage electrodes 126, an anode power supply 134, a filament power supply 136, an extraction power supply 138, an accelerator power supply 140, and lens power supplies 142, 144. The filament power supply 136 provides voltage $V_F$ to heat the ionizer filament 124. The high voltage electrodes 126, which are located in the ionization/acceleration chamber 106, extract the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. The anode power supply 134 provides voltage $V_A$ to an anode of ionizer 122 for accelerating electrons emitted from filament 124 and causing the electrons to bombard the gas clusters in gas jet 118, which produces cluster ions.

The extraction power supply 138 provides voltage $V_E$ to bias at least one of the high voltage electrodes 126 to extract ions from the ionizing region of ionizer 122 and to form the GCIB 128. The accelerator power supply 140 provides voltage $V_{Acc}$ to bias one of the high voltage electrodes 126 with respect to the ionizer 122 so as to result in a total GCIB acceleration energy equal to about $V_{Acc}$ electron volts (eV). The lens power supplies 142, 144 bias some of the high voltage electrodes 126 with potentials (e.g., $V_{L1}$ and $V_{L2}$) to focus the GCIB 128.

By way of example of the biasing potentials, extraction power supply 136 may provide a voltage to a first electrode of the high voltage electrodes 126 that is less than or equal to the anode voltage of ionizer 122 and the accelerator power supply 140 may provide a voltage to a second electrode of the high voltage electrodes 126 that is less than or equal to the anode voltage of ionizer 122 and the extraction voltage of the first electrode. The lens power supply 142 may provide a voltage to a third electrode of the high voltage electrodes 126 that is less than or equal to the anode voltage of ionizer 122, the extraction voltage of the first electrode, and the accelerator voltage of the second electrode. The lens power supply 144 may provide a voltage to a fourth electrode of the high voltage electrodes 126 that is less than or equal to the anode voltage of ionizer 122, the extraction voltage of the first electrode, accelerator voltage of the second electrode, and the first lens voltage of the third electrode.

A beam filter 146 in the ionization/acceleration chamber 106 can be utilized to eliminate monomers, or monomers and light cluster ions from the GCIB 128 to define the filtered process GCIB 230 that enters the processing chamber 108. A beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 230, and a closed state in which the GCIB 128 is blocked from entering the processing chamber 108. A control cable conducts control signals from a control system 190 to the beam gate 148. The control signals controllably switch beam gate 148 between the open or closed states. Alternatively, other ways to turn on or turn off the GCIB 128, and thereby the process GCIB 230, may be employed.

Workpiece 152 can be affixed to the workpiece holder 150 via a clamping system (not shown), such as a mechanical clamping system. Furthermore, workpiece holder 150 can include a heating system (not shown) or a cooling system (not shown) that is configured to adjust and/or control the temperature of workpiece holder 150 and workpiece 152.

The workpiece 152 is disposed in the path of the process GCIB 230 in the processing chamber 108 when affixed to the workpiece holder 150. The workpiece 152 may be a workpiece having an interior surface on an internal cavity or a tubular workpiece, or other workpiece to be processed by GCIB processing wherein the process GCIB 230 is to be re-directed. Because most applications contemplate the processing of large workpieces or workpieces with complex surface topography, a scanning system may be desirable to adjust the position and/or orientation of the workpiece 152 relative to the process GCIB 230.

Referring still to FIG. 1, a scan actuator 160 provides linear motion of the workpiece holder 150 in the direction of X-scan motion (into and out of the plane of the paper) and Y-scan motion 164, which is orthogonal to the X-scan motion. The combination of X-scanning and Y-scanning motions translates the workpiece 152, held by the workpiece holder 150, relative to the process GCIB 230, and may be utilized to effect the treatment of the interior surfaces of workpiece 152. Additionally, the scan actuator 160 may be configured to provide Z-scan motion for workpiece 152 (motion that is substantially parallel with the principal axis of the process GCIB 230).

The workpiece holder 150 positions the workpiece 152 with the process GCIB 230 at an angle with respect to the axis of the process GCIB 230 so that the process GCIB 230 has an angle of beam incidence with respect to a workpiece surface. The angle of beam incidence may be 90° or some other angle.

As described above, the workpiece 152 can be a workpiece having at least one interior surface on an internal cavity. For example, the interior surface of workpiece 152 may include a singly connected domain, or a multiply connected domain. Additionally, for example, workpiece 152 may include a tubular workpiece. The tubular workpiece 152 may include a circular cross-section, a rectangular cross-section, a square cross-section, a triangular cross-section, or a cross-section of arbitrary cross-sectional shape. Additionally, the interior surface or surfaces of the workpiece 152 may include low degrees of curvature (i.e., substantially flat), or it may include high degrees of curvature (i.e., concave and convex undulations, etc.).

According to an embodiment and as shown in FIG. 1, the GCIB processing system 100 includes a beam deflector 162 for re-directing the process GCIB 230 towards a surface 154 on workpiece 152, such as an interior surface on an internal cavity. The beam deflector 162, which is located inside the processing chamber 108, comprises an arm member 169 having a beam deflector surface configured to extend into an internal cavity of workpiece 152 to be processed in the GCIB processing system 100. The beam deflector surface is configured to interact with the process GCIB 230 and, as a consequence of the interaction, re-direct the process GCIB 230 towards the interior surface of the workpiece 152.

Figure 2:
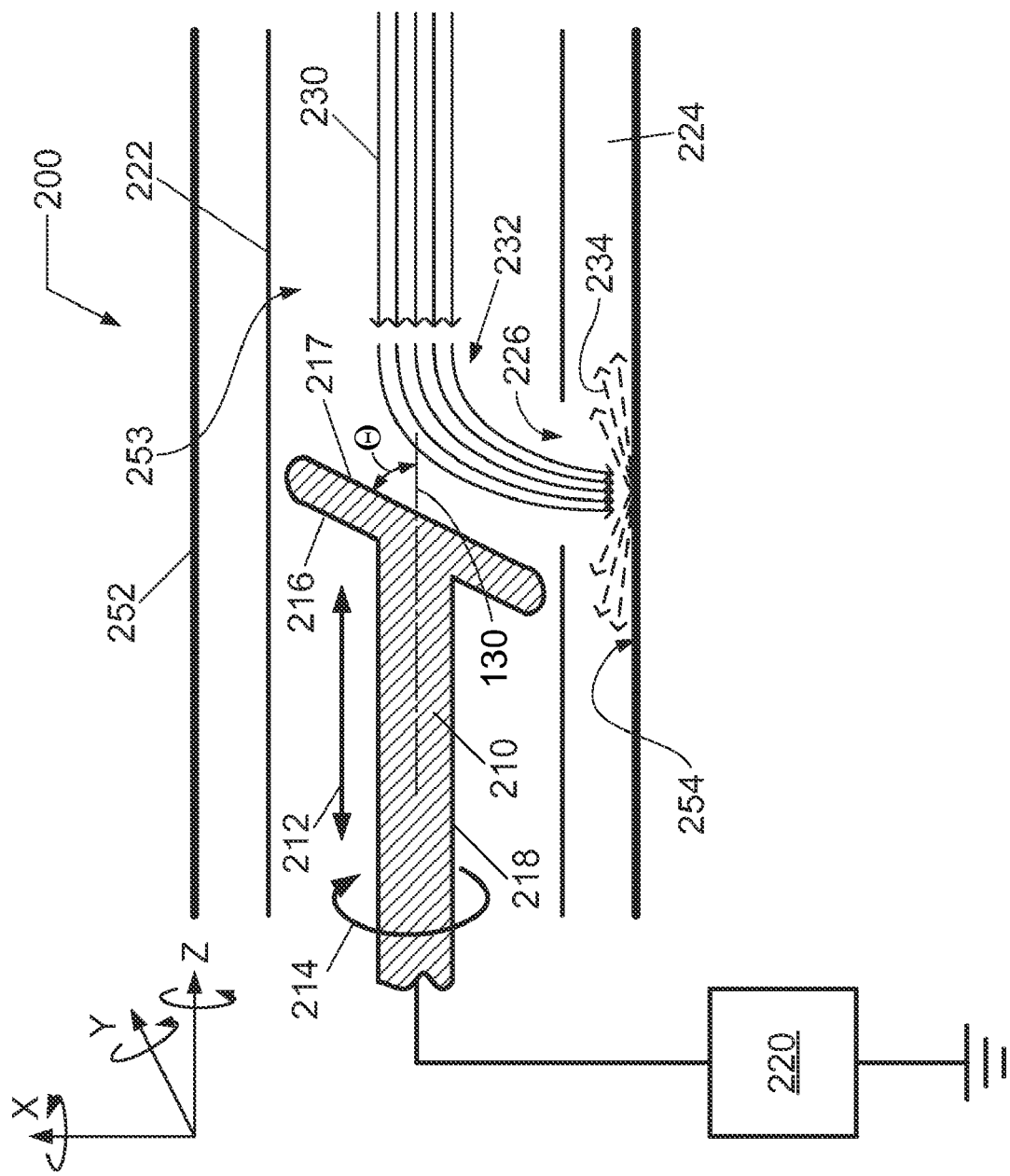
FIG. 2 is diagrammatic view of a beam deflector for the GCIB processing system of FIG. 1 according to another embodiment.

In one embodiment, the beam deflector 162 and beam deflector surface may be electrically coupled with an electrical bias system 220 (FIG. 2). The electrical bias system 220 is configured to electrically bias the beam deflector 162 and beam deflector surface relative to the workpiece 152 and the process GCIB 230. Alternatively, the beam deflector 162 and the beam deflector surface may be electrically self-biased by the GCIB 230. In one embodiment, the GCIB 230 is electrostatically re-directed by the beam deflector surface of the beam deflector 162 toward the surface 154 of the workpiece 152. The electrical biasing of the beam deflector surface of the beam deflector 162 is effective to electrostatically repulse or repel the approaching GCIB 230 toward the interior surface.

As illustrated in FIG. 1, the arm member 169 is configured to position the beam deflector surface within the workpiece 152 and, thereby, to position the beam deflector surface of the beam deflector 162 relative to the process GCIB 230. A beam deflector scan actuator 166 provides linear motion of the beam deflector 162 in the direction of Z-scan motion 165 (relative to the workpiece 152). Additionally, the beam deflector scan actuator 166 provides linear motion of the beam deflector 162 in the direction of X-scan motion (into and out of the plane of the paper) and Y-scan motion, which is orthogonal to the X-scan motion. The combination of X-scanning, Y-scanning, and Z-scanning motions translates the beam deflector 162 within workpiece 152 relative to interior surface 154 and process GCIB 230, and may be utilized to effect the treatment of the interior surfaces of workpiece 152.

An auxiliary scan actuator 168 may be configured to provide rotational motion 167 of the beam deflector surface on beam deflector 162. In one embodiment, the rotational motion 167 may be about an axis 129 substantially parallel with the principal axis of the process GCIB 230. In another embodiment, the rotational motion 167 may be about an axis 129 substantially perpendicular with the principal axis of the process GCIB 230 (i.e., a tilt angle).

A beam current sensor 180 may be disposed beyond the workpiece holder 150 and in the path of the process GCIB 230 so as to intercept a sample of the process GCIB 230 when the workpiece holder 150 is scanned out of the path of the process GCIB 230. The beam current sensor 180 is typically a Faraday cup, or the like, which is closed except for a beam-entry opening. The beam current sensor 180 is typically affixed to the wall of the vacuum vessel 102 with an electrically insulating mount 182.

As shown in FIG. 1, the control system 190 connects to the scan actuator 160, the beam deflector scan actuator 166, and the auxiliary scan actuator 168 through one or more electrical cables (or wireless systems). Control system 190 controls the scan actuator 160, the beam deflector scan actuator 166, and the auxiliary scan actuator 168 in order to adjust the position of the workpiece 152 and the beam deflector 162 relative to one another and relative to the process GCIB 230. Control system 190 receives the sampled beam current collected by the beam current sensor 180 by way of an electrical cable. Based upon the collected beam current, the control system 190 monitors the process GCIB 230. When a predetermined dose (i.e., integrated beam current) of gas cluster ions has been delivered, the control system 190 controls the dose of gas cluster ions received by the workpiece 152 by removing the workpiece 152 from the path of the process GCIB 230 or by actuating the beam gate 148 to block the delivery of the process GCIB 230 to the workpiece 152, as described below.

In operation, the control system 190 signals the opening of the beam gate 148 to irradiate the workpiece 152 with the process GCIB 230. When the dose received by the workpiece 152 reaches a predetermined dose, the control system 190 closes the beam gate 148 and processing of the workpiece 152 is complete. Based upon measurements of the GCIB dose received for a given area of the workpiece 152, the control system 190 can adjust the scan velocity in order to achieve an appropriate beam dwell time to treat the interior surface 154 of workpiece 152 to pre-specified conditions. For example, the pre-specified conditions can include a degree of polishing. The degree of polishing can be characterized by a surface roughness, such as a maximum roughness (Rmax), an average roughness (Ra), or a root-mean-square (rms) roughness (Rq).

Alternatively, the process GCIB beam 230 may be scanned at a constant velocity in a fixed pattern across the interior surface 154 of the workpiece 152; however, the GCIB intensity is modulated (may be referred to as Z-axis modulation) to deliver an intentionally non-uniform dose to the sample. The GCIB intensity may be modulated in the GCIB processing apparatus 100 by any of a variety of methods, including varying the gas flow from a GCIB source supply; modulating the ionizer by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or, alternatively, may be time modulated switching or gating.

Control system 190 comprises a microprocessor, memory, and a digital I/O port capable of generating control voltages sufficient to communicate and activate inputs to GCIB processing system 100 as well as monitor outputs from GCIB processing system 100. Moreover, control system 190 can be coupled to, and can exchange information with, vacuum pumping systems 170A, 170B, and 170C, first gas source 112, second gas source 112B, first gas control valve 113A, second gas control valve 113B, beam electronics 130, beam filter 146, beam gate 148, the scan actuator 160, the beam deflector scan actuator 166, the auxiliary scan actuator 168, the beam deflector electrical bias system 220 (FIG. 2), and beam current sensor 180. For example, a program stored in the memory can be utilized to activate the inputs to the aforementioned components of GCIB processing system 100 according to a process recipe in order to perform a GCIB process on workpiece 152. One example of control system 190 is a DELL PRECISION WORKSTATION 610™, available from Dell Corporation, Austin, Tex.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100, or it can be remotely located relative to the GCIB processing system 100. For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

With reference to FIG. 2, a beam deflector 200 is illustrated that is constructed according to a representative embodiment of beam deflector 162 (FIG. 1) for use with GCIB processing system 100. The beam deflector 200 comprises an arm member 210 configured to extend into an internal cavity 253 of a workpiece 252 to be processed by the GCIB 230, and an end member 216 having a beam deflector surface 217 coupled to the arm member 210 and configured to interact with the GCIB 230 and re-direct the GCIB 230 as re-directed GCIB 232 traveling in a trajectory toward an interior surface 254 of the workpiece 252. The arm member 210, which may be identical to arm member 169 (FIG. 1), may comprise one or more mechanical elements 218 that are designed for extension into and out of the internal cavity 253 of workpiece 252.

A positioning system (not shown) is coupled to the arm member 210. For example, the positioning system mechanically coupled with arm member 210 may be identical to beam deflector scan actuator 166 and the auxiliary scan actuator 168 coupled with arm member 169 (FIG. 1). The positioning system is configured to adjust the position of the beam deflector surface 217 relative to the interior surface 254 and the GCIB 230 by translating the beam deflector surface 217 along, for instance, a translational axis 212, or rotating the beam deflector surface 217 about, for instance, a rotational axis in a rotational direction 214. The positioning system can be implemented to perform translation of the beam deflector surface 217 in any one of or combination of the three orthogonal translational degrees of freedom (X-axis, Y-axis, or Z-axis). In an alternative embodiment, the positioning system can be implemented to rotate the beam deflector surface 217 in any one of or combination of the three orthogonal rotational degrees of freedom (about the X-axis, Y-axis, or Z-axis).

In one embodiment, an electrical bias system 220 may be coupled to the arm member 210 and the beam deflector surface 217. The electrical bias system 220 is configured to electrically bias the arm member 210 and the beam deflector surface 217 relative to the workpiece 252 and the GCIB 230. The electrical bias system 220 may comprise a power supply, such as a direct current (DC) power supply. In one embodiment, the DC power supply can include a variable DC power supply. Alternatively, the DC power supply can include a bipolar DC power supply. The DC power supply can further include a system configured to perform monitoring, adjusting, or controlling the polarity, current, voltage, or on/off state of the DC power supply, or any combination thereof.

For example, the DC voltage applied to arm member 210 and beam deflector surface 217 by the electrical bias system 220 may have an absolute value ranging from approximately 0 volts (V) to approximately 200 kV (kilovolts). In one embodiment, the absolute value of the voltage has a value ranging from approximately 1 kV to approximately 100 kV. In another embodiment, the absolute value of the voltage has a value ranging from approximately 10 kV to approximately 60 kV, e.g., 20 kV.

Additionally, for example, the electrical bias system 220 can be configured to be electrically isolated from the beam deflector 200 so that beam deflector 200 can be used to measure beam currents. Specifically, with the bias voltage switched off, the beam deflector 200 can be used as a collector to measure the GCIB current of process GCIB 230. For instance, this measurement may be useful for GCIB alignment.

The beam deflector 200 may further comprise a shield member 222 disposed proximate the interior surface 254. The shield member 22 may include an aperture 226 to permit the passage of the re-directed GCIB 232 from the beam deflector surface 217 to the interior surface 254. The shield member 222 can define a collection space 224 for collecting debris 234 from the interaction of re-directed GCIB 232 with interior surface 254. Specifically, the debris 234 may be collected on a surface of the shield member 222.

In one embodiment, the shield member 222 can be coupled to a shield temperature control system for adjusting or controlling the temperature of the shield member 222 in order to promote the collection of debris 234 on the surface of shield member 222. The shield temperature control system can include either a heating system (not shown) or a cooling system (not shown) that is configured to adjust and/or control the temperature of shield member 222. For example, shield member 222 can be fabricated from a thermally conductive material and a portion of the shield member can be coupled to a heating device, such as a resistive heating device, or coupled to cooling device, such as a thermo-electric cooling device or cryogenic cooling device.

In one embodiment, the shield member 222 can be coupled to an electrical bias. For example, electrical bias system 220 may be coupled to the shield member 222, and configured to electrically bias the shield member 222 relative to the beam deflector surface 217 and the workpiece 252. For example, the DC voltage applied to shield member 222 by the electrical bias system 220 may have an absolute value ranging from approximately 0 volts (V) to approximately 500 V and, desirably, an absolute value ranging from approximately 0 volts (V) to approximately 100 V.

The beam deflector surface 217 can comprise a substantially flat surface oriented at an angle relative to the incident GCIB 230 (FIG. 2) and oriented in a plane inclined at a non-perpendicular angle, θ, relative to a longitudinal axis 211 of the arm member 210. Additionally, the angle of orientation θ of the beam deflector surface 217 relative to the incident GCIB 230 may be variable. For example, the beam deflector surface 217 may tilt on a manually or automatically adjustable pivot joint at the end of the arm member 210. One or more openings (not shown) may be formed through the end member 216 carrying beam deflector surface 217 in order to permit the passage of gaseous material through the beam deflector 200. In an alternative embodiment, the end member 216 may include a screen or biasable screen.

Figure 3A:
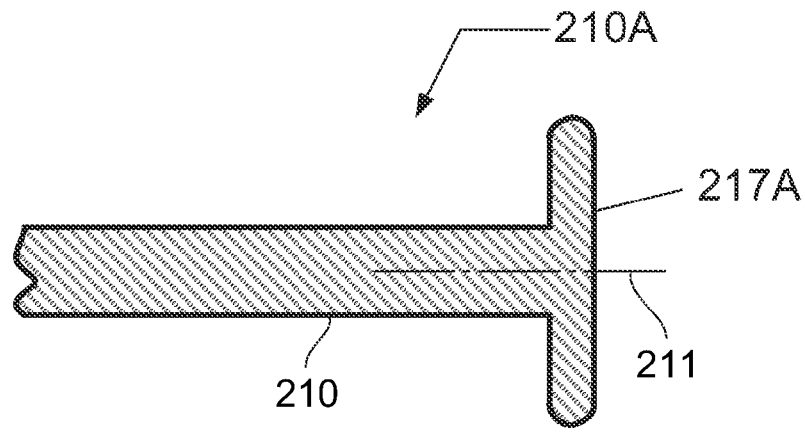
FIGS. 3A through 3C are diagrammatic views similar to FIG. 2 depicting alternative embodiments of the beam deflector.
Figure 3B:
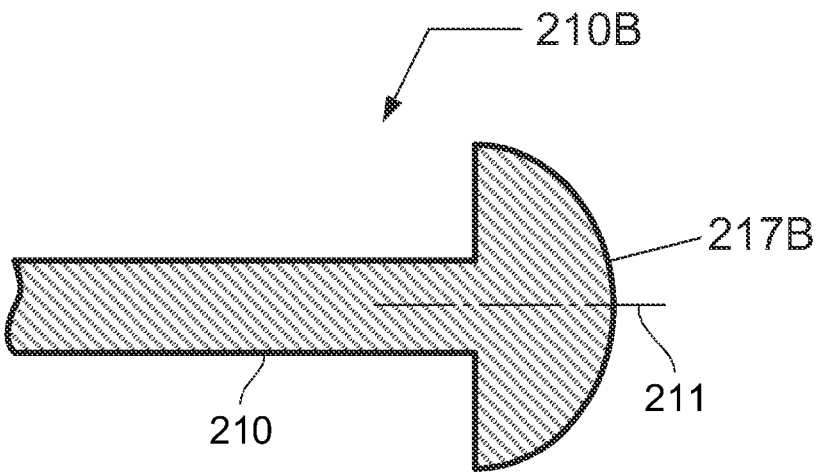
Figure 3C:
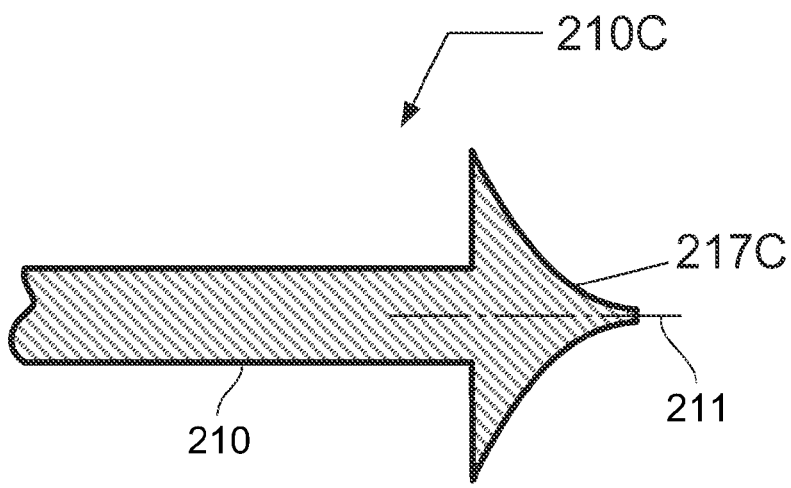

Alternatively, as shown in FIG. 3A, a beam deflector 210A may comprise a substantially flat surface 217A oriented substantially perpendicular to the incident GCIB 230 and oriented in a plane that is substantially perpendicular to the longitudinal axis 211 of the arm member 210. In an alternative embodiment and as shown in FIG. 3B, a beam deflector 210B may comprise a substantially convex surface 217B oriented in front of the incident GCIB 230. The GCIB 230 impinges the substantially convex surface 217B at an impingement position dependent angle of incidence. In another alternative embodiment and as shown in FIG. 3C, a beam deflector 210C may comprise a substantially concave surface 217C oriented in front of the incident GCIB 230 so as to intercept the GCIB 230. The GCIB 230 impinges the substantially concave surface 217C at an impingement position dependent angle of incidence.

Figure 4:
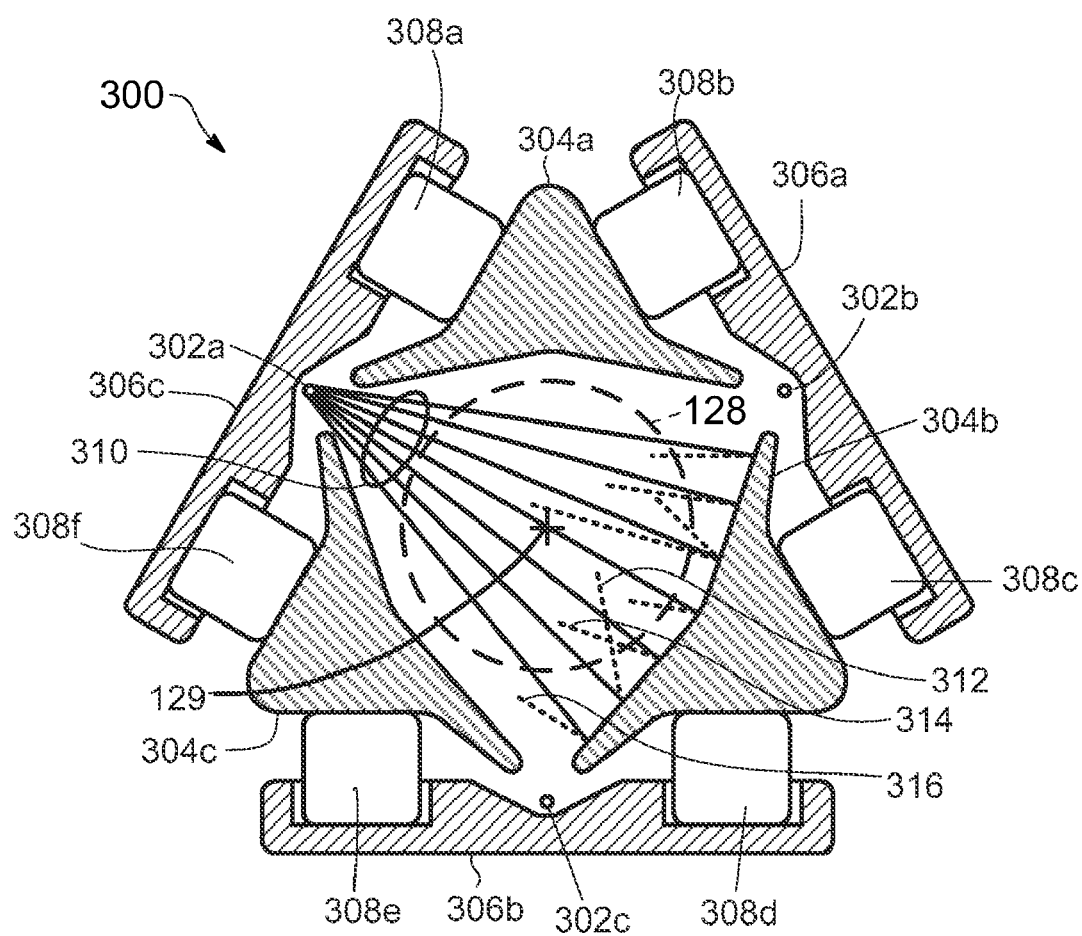
FIG. 4 is cross-sectional view of a gas cluster ionizer for use with the GCIB processing system of FIG. 1.

With reference to FIG. 4, a section of a gas cluster ionizer 300 for use in ionizing a gas cluster jet is shown. The section is viewed from a perspective normal to the axis of GCIB 128. The gas cluster ionizer 300 may be used as the ionizer 122 in the GCIB processing system 100 (FIG. 1). For typical gas cluster sizes (2000 atoms to 15000 atoms), clusters leaving the skimmer aperture 120 (FIG. 1) and entering the ionizer 122 (FIG. 1) will travel with a kinetic energy of about 130 electron volts (eV) to about 1000 eV. At these low energies, any departure from space charge neutrality within the ionizer 122 will result in a rapid dispersion of the jet with a significant loss of beam current. Gas cluster ionizer 300 is a self-neutralizing ionizer. As with other ionizers, gas cluster ionizer 300 ionizes gas clusters by electron impact. Accordingly, gas cluster ionizer 300 includes multiple linear thermionic filaments 302a, 302b, and 302c (typically tungsten) that emit thermo-electrons (seven examples indicated by 310) and electron-repeller electrodes 306a, 306b, and 306c and beam-forming electrodes 304a, 304b, and 304c that supply suitable electric fields that focus the thermo-electrons. Thermo-electrons 310 pass through the gas cluster jet and the jet axis and then strike the opposite beam-forming electrode 304b to produce low energy secondary electrons (312, 314, and 316 indicated for examples).

Although not shown for simplicity of description, linear thermionic filaments 302b and 302c also produce thermoelectrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 μAmps argon GCIBs. Alternatively, other types of ionizers may be employed to ionize the GCIB 128.

Figure 5:
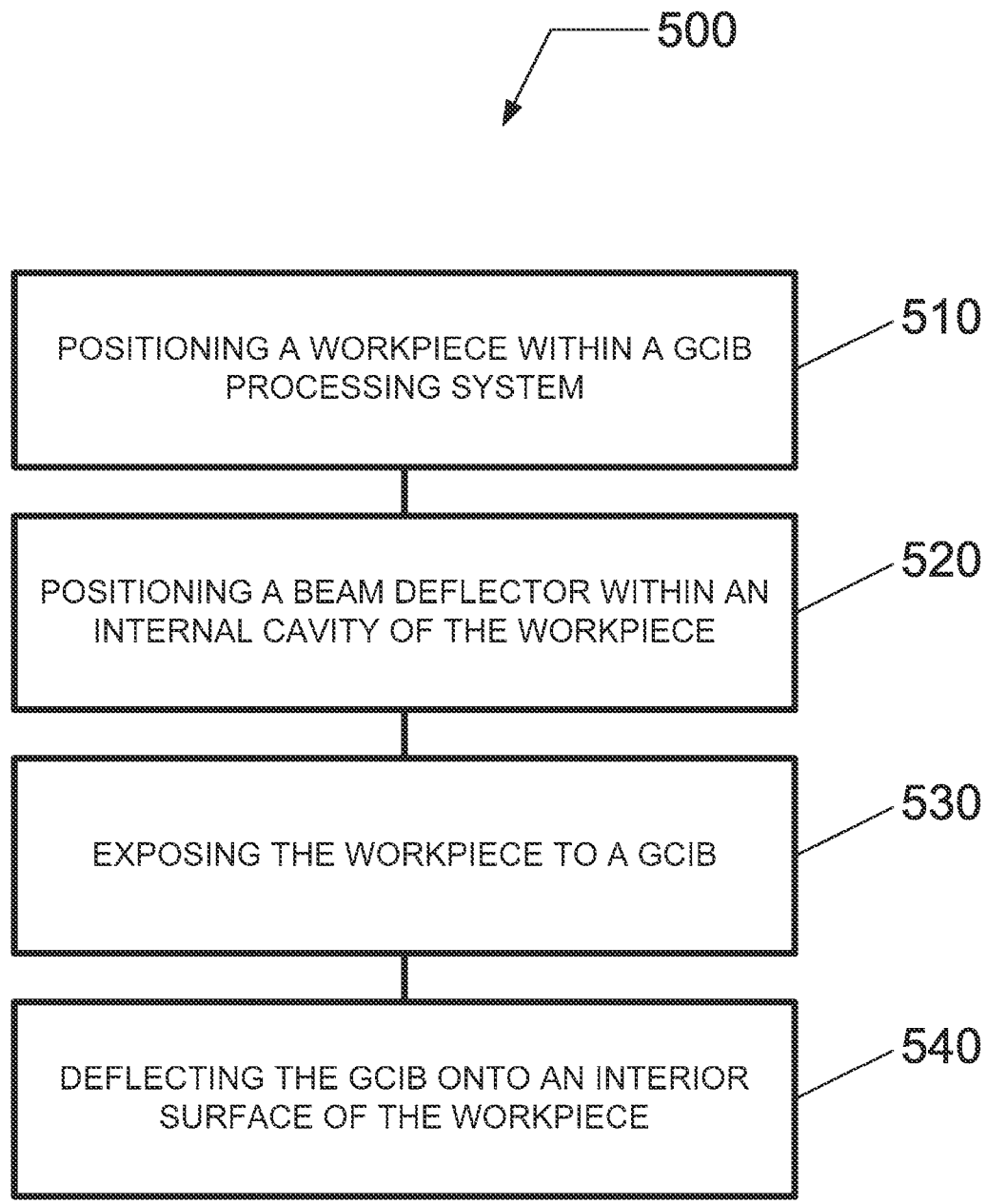
FIG. 5 is a flow chart illustrating a method of treating a workpiece with the GCIB processing system of FIG. 1.

With reference to FIG. 5, a method of treating a workpiece using a gas cluster ion beam (GCIB) processing system is described. The method comprises a flow chart 500 beginning in block 510 with positioning a workpiece in a gas cluster ion beam (GCIB) processing system configured to produce a GCIB. For example, the workpiece may comprise a workpiece having an internal cavity with an interior surface, such as a tubular workpiece. In particular, the workpiece may be workpiece 152 (FIG. 1) or workpiece 252 (FIG. 2). Additionally, for example, the GCIB processing system may comprise the GCIB processing system 100 (FIG. 1).

In block 520, a beam deflector is positioned within the internal cavity of the workpiece, and it is positioned to interact with the GCIB. The beam deflector can be any one of the beam deflectors described in FIGS. 1, 2, 3A, 3B, and 3C.

In block 530, the workpiece is exposed to the GCIB. In block 540, the beam deflector is utilized to re-direct the GCIB towards an interior surface of the workpiece. During the treatment, the position of the workpiece may be adjusted relative to the GCIB or, alternatively, the position of the beam deflector may be adjusted relative to the workpiece. With regard to the latter alternative, the beam deflector may be translated relative to the workpiece, rotated relative to the workpiece, or a combination of these positional adjustments.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of treating a workpiece having an internal cavity with an interior surface, the method comprising:

positioning the workpiece in a charged particle beam processing system configured to produce a charged particle beam;

positioning a beam deflector inside the internal cavity of the workpiece;

exposing the workpiece to said charged particle beam; and re-directing said charged particle beam toward the interior surface of the workpiece using a beam deflector surface of said beam deflector.

2. The method of claim 1, wherein said positioning the workpiece in said charged particle beam processing system further comprises:
positioning the workpiece in a gas cluster ion beam (GCIB) processing system configured to produce a GCIB.

3. The method of claim 2, wherein the workpiece is a tubular workpiece, and positioning the workpiece in the GCIB processing system comprises:
positioning said tubular workpiece within said GCIB processing system.

4. The method of claim 2, wherein the workpiece is an accelerator member, and positioning the workpiece in the GCIB processing system comprises:
positioning said accelerator member within said GCIB processing system.

5. The method of claim 2, wherein the workpiece is a waveguide member, and positioning the workpiece in the GCIB processing system comprises:
positioning said waveguide member within said GCIB processing system.

6. The method of claim 2, further comprising:
adjusting the position of the workpiece relative to said GCIB.

7. The method of claim 2, further comprising:
adjusting the position of said beam deflector relative to the workpiece.

8. The method of claim 7, wherein adjusting the position of said beam deflector further comprises:
translating said beam deflector relative to the workpiece or rotating said beam deflector relative to the workpiece or a combination thereof.

9. The method of claim 2, wherein re-directing said GCIB comprises:
electrically biasing said beam deflector such that said beam deflector surface of said beam deflector electrostatically deflects said GCIB toward the interior surface.

10. The method of claim 2, further comprising:
disposing a shield member between said beam deflector and the interior surface of the workpiece, and
communicating said GCIB from said beam deflector surface to the interior surface through an aperture in said shield member.

11. The method of claim 10, further comprising:
controlling the temperature of said shield member.

12. A processing system configured to treat a workpiece having an internal cavity with an interior surface, said processing system comprising:
a vacuum vessel;
a charged particle beam source disposed in the vacuum vessel, said charged particle beam source configured to produce a charged particle beam;
a workpiece holder configured to support the workpiece inside said vacuum vessel for treatment by said charged particle beam;
a beam deflector disposed in said vacuum vessel, said beam deflector including a beam deflector surface; and
a positioning system mechanically coupled with said beam deflector, said positioning system configured to position said beam deflector surface of said beam deflector inside the internal cavity of the workpiece, and said positioning system configured to move said beam deflector relative to the internal cavity of the workpiece so that said beam deflector surface intercepts and re-directs said charged particle beam toward the interior surface.

13. The processing system of claim 12, wherein said charged particle beam source comprises a gas cluster ion beam (GCIB) source configured to produce a GCIB.

14. The processing system of claim 13, wherein said beam deflector comprises:
an arm member configured to extend into the internal cavity of the workpiece, said arm member carrying the beam deflector surface; and
an electrical bias system electrically coupled to said arm member, said electrical bias system configured to electrically bias said arm member so that said GCIB is electrostatically re-directed by said beam deflector surface toward the interior surface of the workpiece.

15. The processing system of claim 14, wherein said positioning system is configured to adjust the position of said beam deflector surface relative to the interior surface and said GCIB by translating said arm member relative to the workpiece or rotating said arm member relative to the workpiece or both.

16. The processing system of claim 14, further comprising:
a shield member disposed between said arm member and the interior surface, said shield member including an aperture positioned to communicate said GCIB from said beam deflector surface to the interior surface.

17. The processing system of claim 16, further comprising:
a temperature control system coupled to said shield member, said temperature control system configured to cool or heat said shield member.

18. The processing system of claim 14, wherein said source is an inert source or a reactive source.

19. The processing system of claim 14, further comprising:
a controller electrically coupled to said GCIB processing system, electrically coupled to said workpiece holder, electrically coupled to said electrical bias system, and electrically coupled to said positioning system, said controller configured to coordinate the operation of said GCIB processing system, said workpiece holder, said electrical bias system, and said positioning system according to a process recipe for treating the interior surface of the workpiece.

20. A beam deflector for use in a gas cluster ion beam (GCIB) processing system to treat a workpiece having an internal cavity with an interior surface, said beam deflector comprising:
an arm member including a beam deflector surface; and
a positioning system mechanically coupled with said arm member, said positioning system configured to position said arm member such that said beam deflector surface is inside the internal cavity of the workpiece, and said positioning system configured to move said arm member relative to the internal cavity of the workpiece so that said beam deflector surface intercepts and re-directs said GCIB toward the interior surface.

21. The beam deflector of claim 20, further comprising:
an electrical bias system electrically coupled to said arm member, said electrical bias system configured to electrically bias said arm member so that said GCIB is electrostatically re-directed by said beam deflector surface toward the interior surface of the workpiece.

22. The beam deflector of claim 20, wherein said positioning system is configured to adjust the position of said beam deflector surface relative to the interior surface by translating said arm member relative to the workpiece or rotating said arm member relative to the workpiece or both.

23. The beam deflector of claim 20, further comprising:
a shield member between said arm member and the interior surface, said shield member including an aperture positioned to communicate said GCIB from said beam deflector surface to the interior surface.

* * * * *